(12) United States Patent
Jung

(10) Patent No.: US 11,188,260 B2
(45) Date of Patent: Nov. 30, 2021

(54) MEMORY MODULE AND MEMORY SYSTEM INCLUDING THE SAME

(71) Applicant: SK hynix Inc., Gyeonggi-do (KR)

(72) Inventor: Jong-Ho Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/366,223

(22) Filed: Mar. 27, 2019

(65) Prior Publication Data

US 2020/0089431 A1    Mar. 19, 2020

(30) Foreign Application Priority Data

Sep. 17, 2018  (KR) .......................... 10-2018-0110945

(51) Int. Cl.
| | |
|---|---|
| G06F 3/06 | (2006.01) |
| G11C 11/4096 | (2006.01) |
| G11C 11/4093 | (2006.01) |
| G11C 11/4076 | (2006.01) |

(52) U.S. Cl.
CPC .......... *G06F 3/0659* (2013.01); *G06F 3/0604* (2013.01); *G06F 3/0647* (2013.01); *G06F 3/0656* (2013.01); *G06F 3/0673* (2013.01); *G11C 11/4076* (2013.01); *G11C 11/4093* (2013.01); *G11C 11/4096* (2013.01)

(58) Field of Classification Search
None
See application file for complete search history.

(56) References Cited

U.S. PATENT DOCUMENTS

| | | | |
|---|---|---|---|
| 2009/0052260 A1* | 2/2009 | Kim ..................... | G11C 7/1093 365/189.05 |
| 2009/0150636 A1 | 6/2009 | Gower et al. | |
| 2014/0059280 A1* | 2/2014 | Im .......................... | G06F 3/061 711/103 |
| 2015/0149820 A1* | 5/2015 | Song .................... | G06F 11/2017 714/14 |
| 2016/0147482 A1* | 5/2016 | Jang .................... | G06F 12/0238 711/103 |
| 2017/0206945 A1* | 7/2017 | Lin ..................... | G11C 16/0458 |
| 2018/0039588 A1* | 2/2018 | Yun .......................... | G11C 5/04 |
| 2018/0181504 A1* | 6/2018 | Morris ................ | G11C 11/4076 |
| 2019/0079699 A1* | 3/2019 | Lee ........................ | G06F 3/0659 |
| 2019/0080774 A1* | 3/2019 | Lee ..................... | G06F 13/1689 |

FOREIGN PATENT DOCUMENTS

KR   10-2018-0127710    11/2018

* cited by examiner

*Primary Examiner* — Ryan Bertram
*Assistant Examiner* — Trang K Ta
(74) *Attorney, Agent, or Firm* — IP & T Group LLP

(57) ABSTRACT

A memory module includes a plurality of memory devices; a plurality of data buffers suitable for exchanging data with a memory controller; and a module controller suitable for transferring the data between the memory devices and the data buffers based on a command, an address and a clock provided from the memory controller, calculating delay times for transferring the data according to locations of the data buffers, and controlling times at which the data are transferred based on the calculated delay times.

16 Claims, 13 Drawing Sheets

MEMORY MODULE AND MEMORY SYSTEM INCLUDING THE SAME

CROSS-REFERENCE TO RELATED APPLICATION

This application claims priority under 35 U.S.C. § 119 to Korean Patent Application No. 10-2018-0110945, filed on Sep. 17, 2018, in the Korean Intellectual Property Office, the disclosure of which is incorporated herein by reference in its entirety.

BACKGROUND

1. Field

Various embodiments of the present invention relate to a memory module and a memory system including the same.

2. Description of the Related Art

In recent years, use of mobile communication devices such as smart phones and tablet personal computers have widely spread, and use of social network services (SNS), machine-to-machine (M2M) networks, and sensor networks have increased. Consequently, the amount and diversity of data, as well as the speed at which such data is generated, are all increasing rapidly.

In order to process big data, not only is memory speed important, but also memory capacity needs to be extremely large.

SUMMARY

Various embodiments are directed to a memory module that may calculate a delay time required for transferring data between data buffers and a module controller included therein and adjust a data transfer timing during a write or read operation based on the calculated delay time.

In accordance with an embodiment, a memory module includes: a plurality of memory devices; a plurality of data buffers suitable for exchanging data with a memory controller; and a module controller suitable for transferring the data between the memory devices and the data buffers based on a command, an address and a clock provided from the memory controller, calculating delay times for transferring the data according to locations of the data buffers, and controlling times at which the data are transferred based on the calculated delay times.

In accordance with an embodiment, a memory system includes: a memory module; and a memory controller suitable for providing a command, an address and a clock to the memory module, and exchanging data with the memory module, wherein the memory module includes: a plurality of memory devices; a plurality of data buffers suitable for exchanging data with the memory controller; and a module controller suitable for transferring the data between the memory devices and the data buffers based on the command, the address and the clock, calculating delay times for transferring the data according to locations of the data buffers, and controlling times at which the data are transferred based on the calculated delay times.

In accordance with an embodiment, an operating method of a memory system comprises: generating, in a training mode, a plurality of additional delay signals by counting clock cycles from when a training signal transferred from a data buffer, among multiple data buffers, located farthest from a module controller to when training signals transferred from the other of the multiple data buffers become enabled; and selectively delaying the data transferred from the data buffers based on the additional delay signals and outputting the delayed data to memory devices, in a write operation.

In accordance with an embodiment, a memory module includes: a plurality of memory devices suitable for storing data; a plurality of buffers suitable for buffering data to be stored in the memory devices; and a controller suitable for aligning in time buffered data according to delay-compensation times, and providing the aligned data to the memory devices, wherein the buffered data are provided from the buffers which are disposed at different locations with reference to the controller, and wherein the controller generates the delay-compensation times based on relative delays of training data provided from the buffers to the controller, respectively.

DETAILED DESCRIPTION

Figure 1:
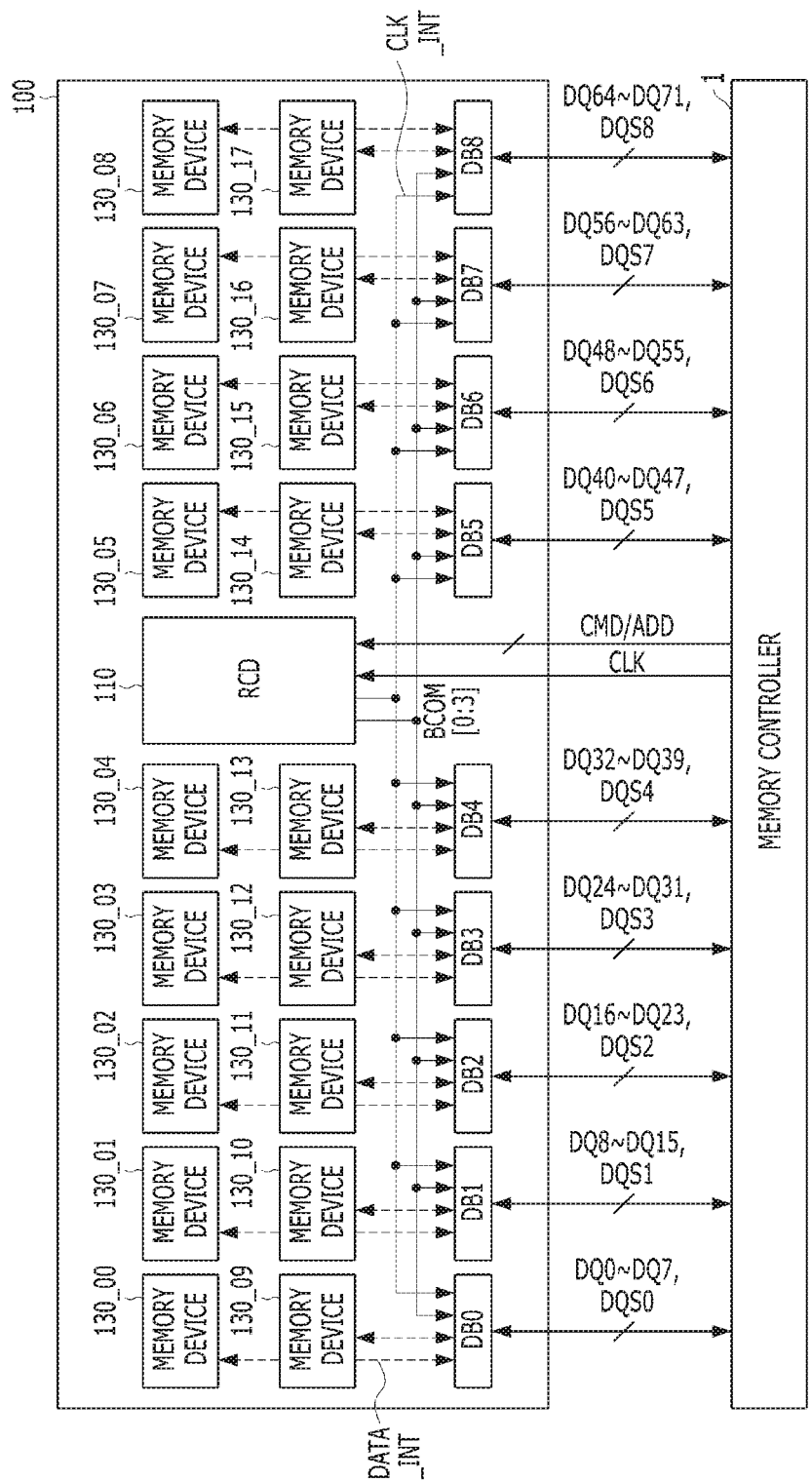
FIG. 1 is a block diagram illustrating a memory system in accordance with an embodiment.

Various embodiments of the present invention are described below in more detail with reference to the accompanying drawings. In doing so, description of well-known functions or configurations are omitted so as not to unnecessarily obscure the subject matter of the present invention. Throughout the disclosure, like reference numerals refer to like parts throughout the various figures and embodiments of the present invention. Also, throughout the specification, reference to "an embodiment," "another embodiment" or the like is not necessarily to the same embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a block diagram illustrating a memory system in accordance with an embodiment.

Referring to FIG. 1, the memory system may include a memory controller 1 and a memory module 100.

The memory controller 1 may receive a request from a host (not shown), transfer a command CMD, an address ADD and a clock CLK to the memory module 100, and transfer and receive data DQ0 to DQ71 and data strobe signals DQS0 to DQS8 to and from the memory module 100 in order to control read and write operations of the memory module 100. The memory controller 1 may be included in a processor such as a central processing unit (CPU), a graphic processing unit (GPU) and an application processor (AP) or employed in a separate semiconductor chip external to the processor. For example, the memory controller 1 may be employed in any of various systems using the memory module 100, such as a PC, a server system and a mobile system.

The memory module 100 may include a register clock driver (RCD) 110, data buffers DB0 to DB8 and memory devices 130_00 to 130_17. The memory module 100 shown in FIG. 1 is referred to as a load reduced dual in-line memory module (LRDIMM).

The RCD 110 may buffer the command CMD, address ADD and clock CLK provided from the memory controller 1 and provide them to the memory devices 130_00 to 130_17. The RCD 110 may also provide the clock CLK to the data buffers DB0 to DB8. In addition, the RCD 110 may process information on the command CMD and the address ADD, which is to be provided for the data buffers DB0 to DB8, into the form of a buffer control signal BCTRL (not shown), and provide the processed information to the data buffers DB0 to DB8 through the buffer communication bus BCOM<0:3>.

The data buffers DB0 to DB8 may receive the data DQ0 to DQ71 and the data strobe signals DQS0 to DQS8 from the memory controller 1 and transfer them to the memory devices 130_00 to 130_17 in a write operation, and may receive the data DQ0 to DQ71 and the data strobe signals DQS0 to DQS8 from the memory devices 130_00 to 130_17 and transfer them to the memory controller 1 in a read operation. Since the data buffers DB0 to DB8 in the memory module 100 directly exchange the data DQ0 to DQ71 with the memory controller 1, the data buffers DB0 to DB8 may receive, in the write operation, the data DQ0 to DQ71 from the memory controller 1 when a write latency (WL) elapses from a time at which a write command is applied from the memory controller 1. Further, in the read operation, the data buffers DB0 to DB8 may transfer the data DQ0 to DQ71 to the memory controller 1 when a CAS latency (CL) elapses from a time at which a read command is applied from the memory controller 1. Therefore, the data buffers DB0 to DB8 may require information on the application time of the write command and the application time of the read command, and receive the information on the application times of the write and read commands through the buffer communication bus BCOM<0:3> from the RCD 110. In addition, information for setting up the data buffers DB0 to DB8 may be provided to the data buffers DB0 to DB8 through the buffer communication bus BCOM<0:3> from the RCD 110. Meanwhile, in the memory module 100, a single data buffer may transfer and receive data to and from two or more memory devices. For example, the data buffer DB0 may transfer and receive the data DQ0 to DQ7 to and from the two memory devices 130_00 and 130_09.

The memory devices 130_00 to 130_17 may receive the command CMD, the address ADD and the clock CLK from the RCD 110, and transfer and receive the data DQ0 to DQ7 through the data buffers DB0 to DB8.

In FIG. 1, "DATA_INT" may denote buses through which data are transferred between the data buffers DB0 to DB8 and the memory devices 130_00 to 130_17 in the memory module 100, and "CLK_INT" may denote a bus through which a clock is transferred to the data buffers DB0 to DB8 from the RCD 110 in the memory module 100. Although not illustrated in FIG. 1, a bus through which a command, an address and a clock, e.g., CMD/ADD/CLK_INT, are transferred to the memory devices 130_00 to 130_17 from the RCD 110 in the memory module 100 may be additionally arranged.

Figure 2:
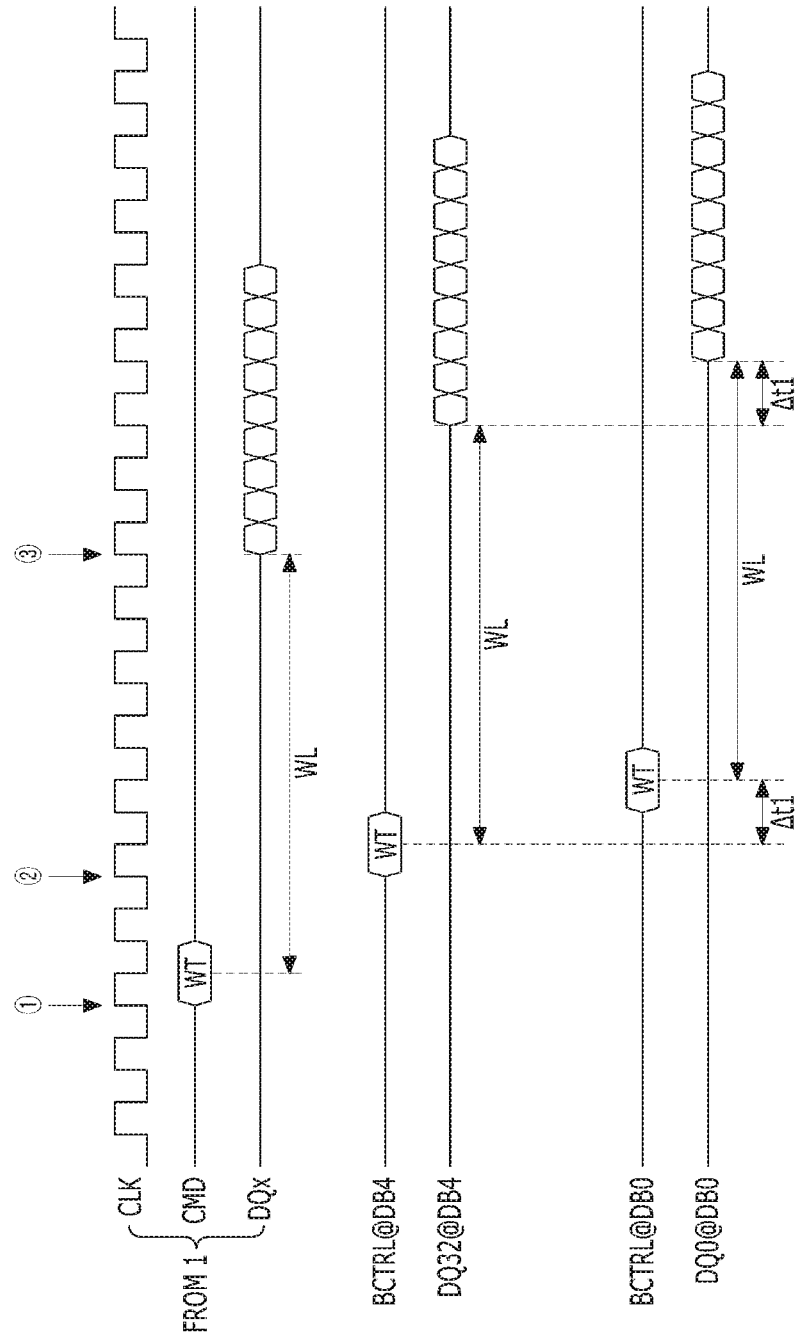
FIG. 2 is a timing diagram illustrating a write operation of a memory module such as that shown in FIG. 1.

FIG. 2 is a timing diagram for describing the write operation of the memory module 100 shown in FIG. 1.

Referring to FIG. 2, "CLK" denotes a clock which is transferred to the RCD 110 from the memory controller 1, "CMD" denotes a command which is transferred to the RCD 110 from the memory controller 1, and "DQx" denotes data transferred to the RCD 110 from the memory controller 1. In addition, "@DB0" or "@DB4" denotes a line of a corresponding data buffer DB0 or DB4 or a signal which a corresponding data buffer DB0 or DB4 receives. Hereinafter, a case where the data DQx is set to a burst length of '8' and 8 pieces of data are inputted at one time will be described as an example.

At a first time point ①, a write command WT may be transferred to the RCD 110 from the memory controller 1. Accordingly, the memory module 100 may perform the write operation.

Then, at a second time point ② when two periods of the clock CLK elapse from the first time ①, the RCD 110 may transfer the write command WT to the memory devices 130_00 to 130_17. Simultaneously, the RCD 110 may transfer the write command WT changed into the form of the buffer control signal BCTRL to the data buffers DB0 to DB8 through the buffer communication bus BCOM<0:3>. Since the physical locations of the data buffers DB0 to DB8 with reference to the RCD 110 are different from one another, the times at which the buffer control signal BCTRL reaches the respective data buffers DB0 to DB8 through the buffer communication bus BCOM<0:3> are different. For example, the data buffer DB0 may receive a buffer control signal BCTRL@DB0 after a time Δt1 elapses, while the data buffer DB4 receives a buffer control signal BCTRL@DB4 without delay at the second time point ②.

Subsequently, at a third time point ③ when a write latency WL elapses, the data DQx may be inputted to the RCD 110 from the memory controller 1. The data buffer DB4 may receive data, for example, DQ32@DB4, when the write latency WL elapses from the second time point ② at which the buffer control signal BCTRL@DB4 is inputted. The data buffer DB0 may receive data, for example, DQ0@DB0, when the time Δt1 and the write latency WL elapse from the second time ②.

As shown above, the differences among the times when the buffer control signal BCTRL reaches the data buffers DB0 to DB8 from the RCD 110 may cause a skew of the time Δt1.

Figure 3:
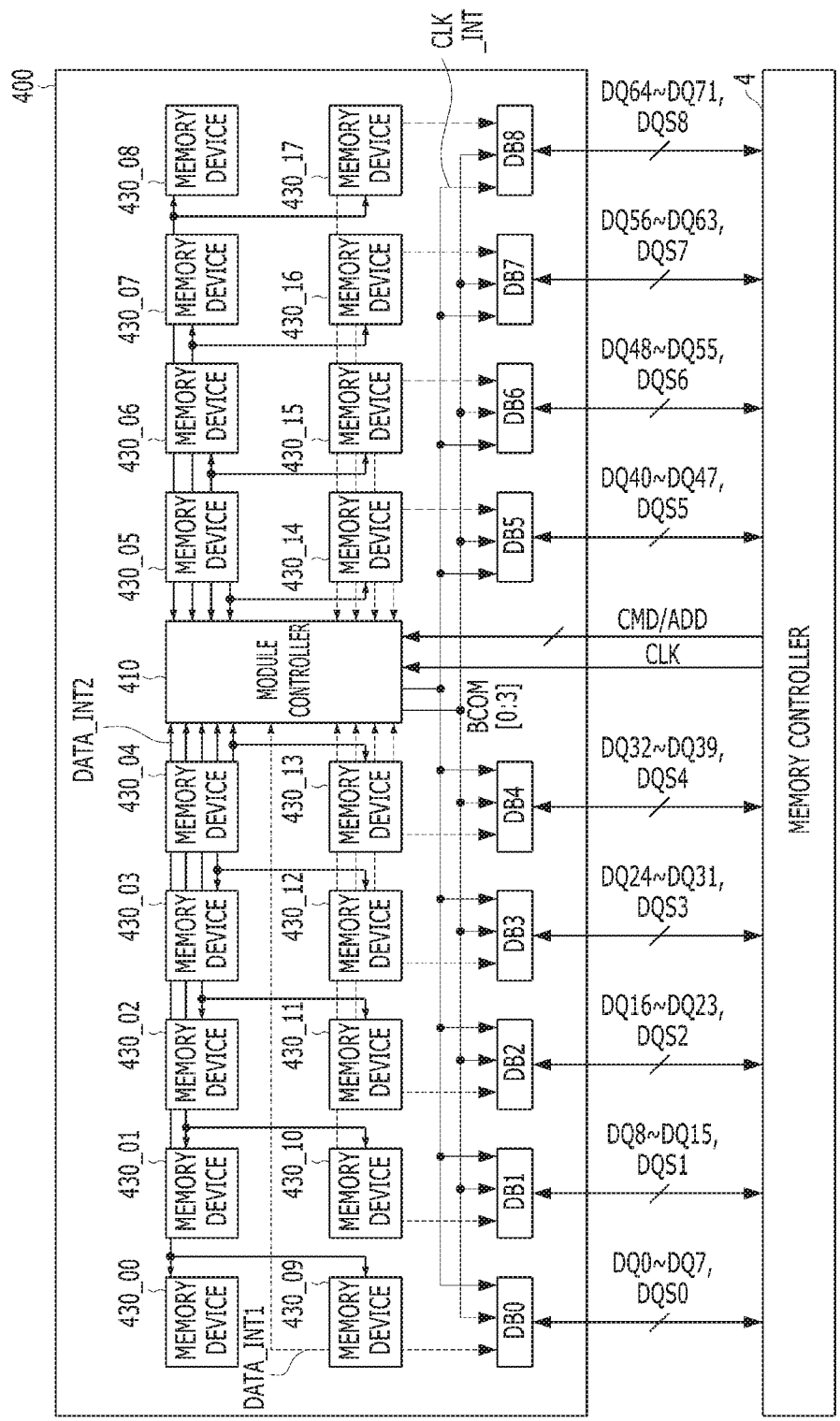
FIG. 3 is a block diagram illustrating a memory system in accordance with an embodiment.

FIG. 3 is a block diagram illustrating a memory system in accordance with an embodiment.

Referring to FIG. 3, the memory system may include a memory controller 4 and a memory module 400.

The memory controller 4 may receive a request from a host (not shown), transfer a command CMD, an address ADD and a clock CLK to the memory module 400, and transfer and receive data DQ0 to DQ71 and data strobe signals DQS0 to DQS8 to and from the memory module 400 in order to control read and write operations of the memory module 400. The memory controller 4 may be included in a processor such as a central processing unit (CPU), a graphic processing unit (GPU) and an application processor (AP) or employed in a separate semiconductor chip external to the processor. For example, the memory controller 4 may be employed in any of various systems using the memory module 400, such as a PC, a server system and a mobile system.

The memory module 400 may include a module controller 410, data buffers DB0 to DB8, and memory devices 430_00 to 430_17.

Each of the memory devices 430_00 to 430_17 may have a relatively large capacity. To this end, each of the memory devices 430_00 to 430_17 may include a plurality of memory chips which are stacked. For example, each of the memory devices 430_00 to 430_17 may include eight memory chips, and the entire memory devices 430_00 to 430_17 of the memory module 400 may include 64 memory chips. In a case where a plurality of memory chips are stacked to increase the capacities of the memory devices 430_00 to 430_17, loading increases and routing of a large number of signals becomes difficult. For these reasons, the latencies of the memory devices 430_00 to 430_17 inevitably increase, and a number of errors inevitably occur during write and read operations. Each of the memory devices 430_00 to 430_17 may be one among various kinds of memories such as a dynamic random access memory (DRAM), a resistive random access memory (RRAM), a phase-change random access memory (PRAM), a ferroelectric random access memory (FRAM), and a magnetic random access memory (MRAM).

The data buffers DB0 to DB8 may receive the data DQ0 to DQ71 and the data strobe signals DQS0 to DQS8 from the memory controller 4 and transfer them to the module controller 410 in the write operation, and may receive the data DQ0 to DQ71 and the data strobe signals DQS0 to DQS8 from the module controller 410 and transfer them to the memory controller 4 in the read operation. In the write operation, the data buffers DB0 to DB8 have to receive the data DQ0 to DQ71 from the memory controller 4 when a write latency (WL) elapses from the time at which a write command is applied from the memory controller 4. Further, in the read operation, the data buffers DB0 to DB8 have to transfer the data DQ0 to DQ71 to the memory controller 4 when a CAS latency (CL) elapses from the time at which a read command is applied from the memory controller 4. Therefore, the data buffers DB0 to DB8 may require information on the application time of the write command and the application time of the read command and receive the information on the application times of the write and read commands through the buffer communication bus BCOM<0:3> from the module controller 410. In addition, information for setting up the data buffers DB0 to DB8 may be provided to the data buffers DB0 to DB8 through the buffer communication bus BCOM<0:3> from the module controller 410. Meanwhile, in the memory module 400, a single data buffer may transfer and receive data to and from two or more memory devices. For example, the data buffer DB0 may transfer and receive the data DQ0 to DQ7 to and from the two memory devices 430_00 and 430_09.

The module controller 410 may transfer the data DQ0 to DQ71 between the data buffers DB0 to DB8 and the memory devices 430_00 to 430_17 based on the command CMD, address ADD and clock CLK provided from the memory controller 4. The module controller 410 may buffer the command CMD, address ADD and clock CLK provided from the memory controller 4 and provide them to the memory devices 430_00 to 430_17. The module controller 410 may also provide the clock CLK to the data buffers DB0 to DB8. In addition, the module controller 410 may process information on the command CMD and the address ADD, which is to be provided for the data buffers DB0 to DB8, into the form of a buffer control signal BCTRL (not shown), and may provide the processed information to the data buffers DB0 to DB8 through the buffer communication bus BCOM<0:3>. The above-described operations of the module controller 410 may be the same as the operations of the RCD 110 shown in FIG. 1.

Unlike the RCD 110, however, the module controller 410 may perform the function of transferring the data DQ0 to DQ71 and the data strobe signals DQS0 to DQS8 between the data buffers DB0 to DB8 and the memory devices 430_00 to 430_17. For example, in the write operation, the module controller 410 may generate an error correction code (ECC) by using write data transferred from the data buffers DB0 to DB8. The module controller 410 may transfer the write data and the error correction code to the memory devices 430_00 to 430_17 such that the write data and the error correction code may be written into the memory devices 430_00 to 430_17. Moreover, in the read operation, the module controller 410 may correct errors in read data from the memory devices 430_00 to 430_17 by using an error correction code read from the memory devices 430_00 to 430_17, and transfer error-corrected read data to the data buffers DB0 to DB8.

In FIG. 3, "DATA_INT1" may denote buses through which data are transferred between the data buffers DB0 to DB8 and the module controller 410 in the memory module 400, "DATA_INT2" may denote buses through which data are transferred between the module controller 410 and the memory devices 430_00 to 430_17, and "CLK_INT" may denote a bus through which a clock is transferred to the data buffers DB0 to DB8 from the module controller 410 in the memory module 400. Although not illustrated in FIG. 3, a bus through which a command, an address and a clock, e.g., CMD/ADD/CLK_INT, are transferred to the memory devices 430_00 to 430_17 from the module controller 410 may be additionally arranged in the memory module 400. Data may be transferred through the first internal data buses DATA_INT1 between the data buffers DB0 to DB8 and the module controller 410, and data and an error correction code may be transferred through the second internal data buses DATA_INT2 between the module controller 410 and the memory devices 430_00 to 430_17. By the error correction code generating operation and the error correcting operation of the module controller 410, it is possible to prevent an increase in errors due to the expanded capacities of the memory devices 430_00 to 430_17 and the plurality of stacked memory chips included in each of the memory devices 430_00 to 430_17.

Figure 4:
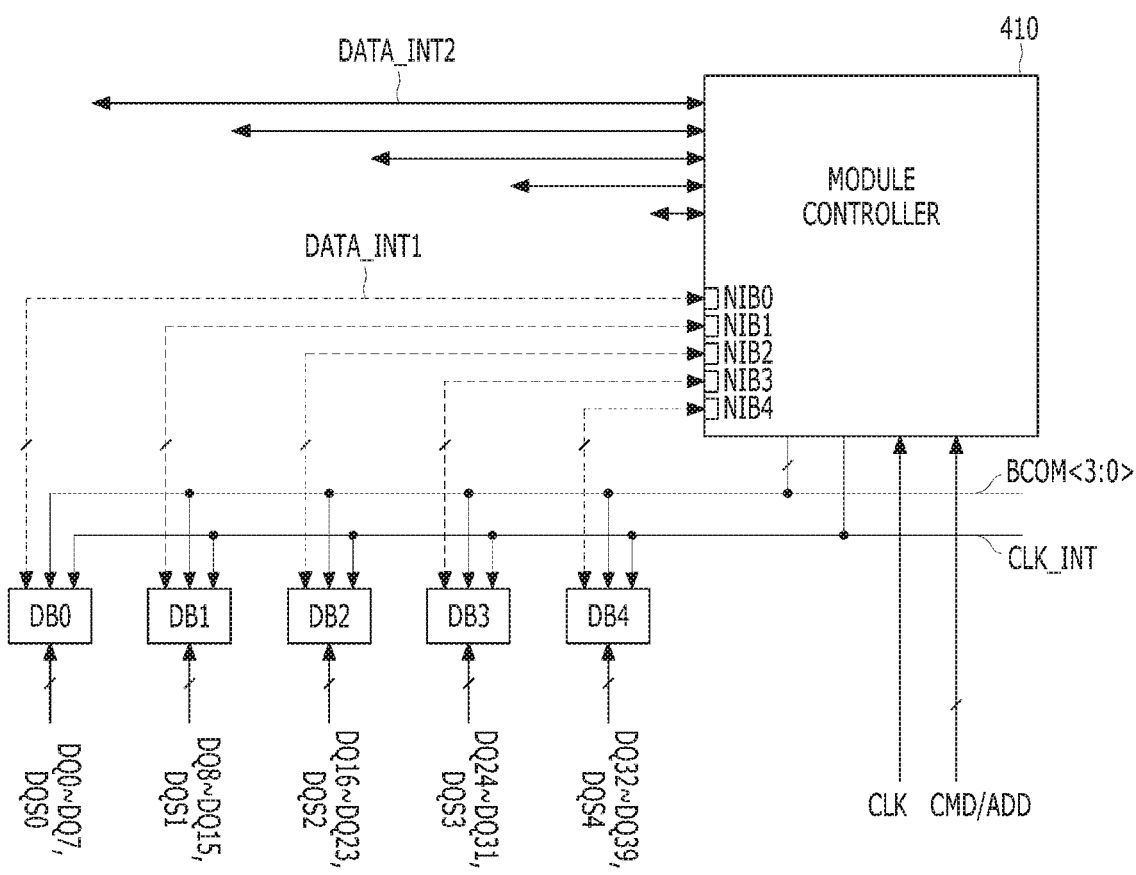
FIG. 4 is a diagram illustrating a portion of a memory module such as that shown in FIG. 3.

FIG. 4 is a diagram illustrating a portion of the memory module 400 shown in FIG. 3.

FIG. 4 illustrates only five data buffers DB0 to DB4 and the module controller 410 of the memory module 400 of FIG. 3. The memory module 400 of FIGS. 3 and 4 is different from the memory module 100 of FIG. 1 in that the module controller 410 directly transfers the data DQ0 to DQ71 to, and receives it from, the data buffers DB0 to DB8 and the memory devices 430_00 to 430_17 in read and write operations. For example, in the write operation, data inputted through the data buffers DB0 to DB8 may be transferred to the module controller 410 through the first internal data bus DATA_INT1. In the read operation, data read from the memory devices 430_00 to 430_17 may be transferred to the module controller 410 through the second internal data bus DATA_INT2. Therefore, the data transfer timings of the module controller 410 may need to accurately coincide with the data transfer timings of the data buffers DB0 to DB8.

By way of example, it will be described that the module controller 410 receives data transferred through the first internal data bus DATA_INT1 through input terminals NIB0 to NIB4. Although each of the input terminals NIB0 to NIB4 is shown as one pin in the drawing, each of the input terminals NIB0 to NIB4 may be actually composed of a plurality of pins, for example, eight pins, corresponding to the number of data pads.

Figure 5:
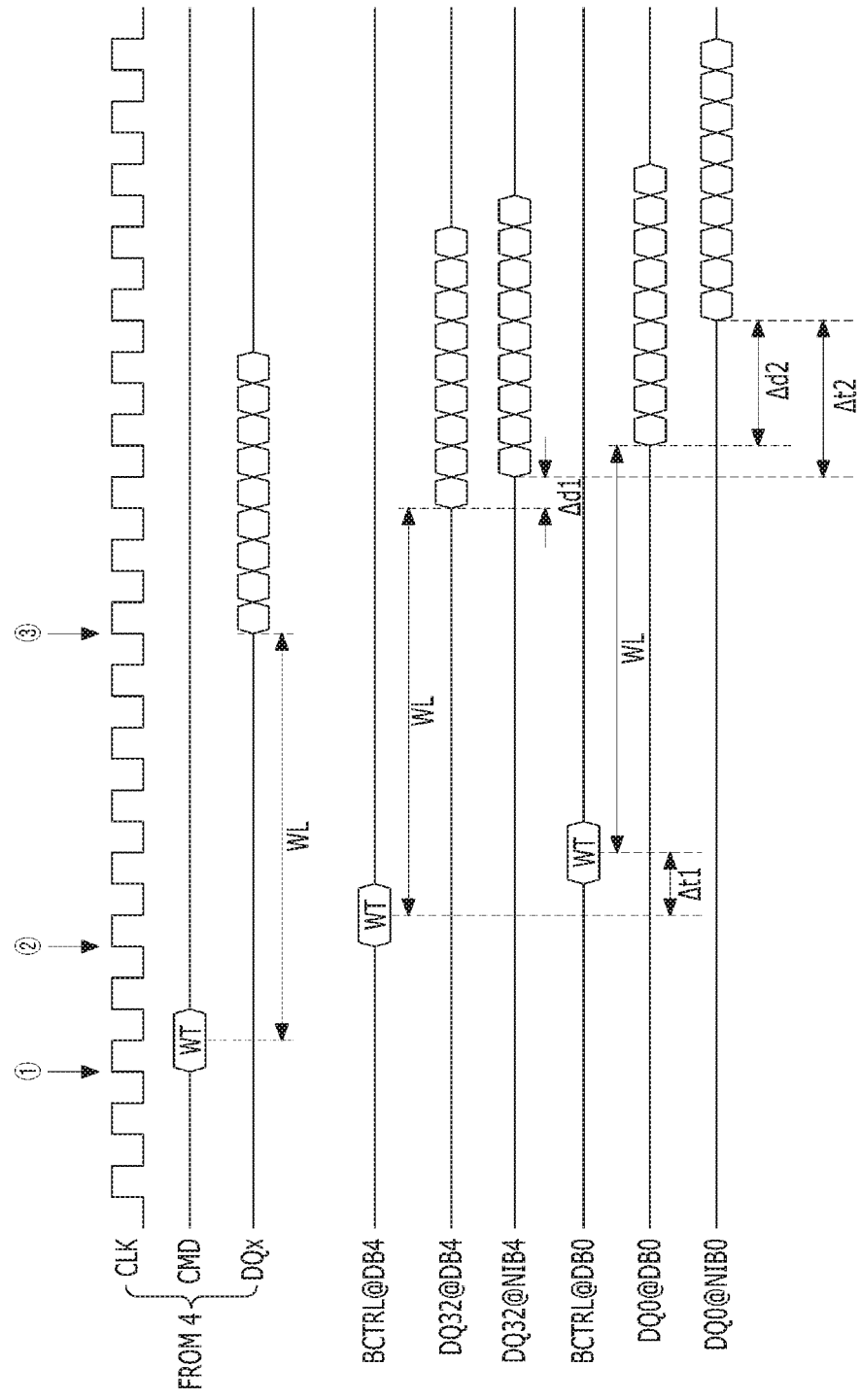
FIG. 5 is a timing diagram illustrating a write operation of a memory module such as that shown in FIG. 3.

FIG. 5 is a timing diagram for describing the write operation of the memory module 400 shown in FIG. 3.

Referring to FIG. 5, "@NIB0" or "@NIB4" denotes a line of a corresponding input terminal of the module controller 410 or a signal which the corresponding input terminal NIB0 or NIB4 receives.

In the write operation, a write command WT is transferred to the module controller 410 from the memory controller 4 at a first time point ①. Accordingly, the memory module 400 may perform the write operation.

Then, at a second time point ② when two periods of the clock CLK elapse from the first time point D, the module controller 410 may transfer the write command WT to the memory devices 430_00 to 430_17. Simultaneously, the module controller 410 may transfer the write command WT changed into the form of the buffer control signal BCTRL to the data buffers DB0 to DB8 through the buffer communication bus BCOM<0:3>. Since the physical locations of the data buffers DB0 to DB8 with reference to the module controller 410 are different from one another, the buffer control signal BCTRL reaches the respective data buffers DB0 to DB8 through the buffer communication bus BCOM<0:3> at different times.

Subsequently, at a third time point ③ when a write latency WL elapses from the first time point ①, data DQx is inputted to the module controller 410 from the memory controller 4. The data buffer DB4 may receive data DQ32@DB4, when the write latency WL elapses from the second time point ② at which the buffer control signal BCTRL@DB4 is inputted. On the other hand, the data buffer DB0 may receive data DQ0@DB0, when a time Δt1 and the write latency WL elapse from the second time point ②.

Differently from the write operation of the memory module 100 described above with reference to FIG. 2, the module controller 410 included in the memory module 400 of FIG. 3 receives data from the data buffers DB0 to DB8. As shown in FIGS. 3 and 4, the routing length between the module controller 410 and the data buffer DB0 is the longest and the routing length between the module controller 410 and the data buffer DB4 is the shortest. The input timings of data transferred to the input terminals NIB0 to NIB8 of the module controller 410 are different due to the differences in the routing lengths between the module controller 410 and the respective data buffers DB0 to DB8. For example, data DQ32@NIB4 is inputted to the input terminal NIB4 of the module controller 410 after a first delay time Δd1 elapses from the time when the data buffer DB4 transfers the data DQ32@DB4 to the first internal data bus DATA_INT1. On the other hand, data DQ32@NIB0 is inputted to the input terminal NIB0 of the module controller 410 after a second delay time Δd2 elapses from the time when the data buffer DB0 transfers data DQ32@DB0 to the first internal data bus DATA_INT1. At this time, the second delay time Δd2 is longer than the first delay time Δd1.

Consequently, a skew Δt2 occurring in the write operation of the memory module 400 of FIG. 5 becomes larger by more than 1tCK than the skew Δt1 occurring in the write operation of the memory module 100 of FIG. 2. Thus, in the memory module 400 of FIG. 3, the skew Δt2 due to the differences in routing lengths by the physical locations of the data buffers DB0 to DB8 acts as a more serious factor.

In order to reduce the skew Δt2, there is a method of setting the latency differently for each of the data buffers DB0 to DB8. However, this method may be a cumbersome task because it requires individual training after the PBA (Per Buffer Addressability) mode starts.

In accordance with an embodiment, a method is provided for improving the operational margin of the memory module by calculating a delay time required for transferring data between the module controller 410 and each of the data buffers DB0 to DB8 and adjusting the data transfer timing in the write operation or the read operation according to the calculated delay time.

By way of example, a case where only five data buffers DB0 to DB4 and the module controller 410 of the memory module 400 as shown in FIG. 4 are configured will be described. In other words, a case where the fifth data buffer DB4 is disposed at the position closest to the module controller 410 in the memory module 400 and the first data buffer DB0 is disposed at the position farthest from the module controller 410 will be described as an example.

Figure 6:
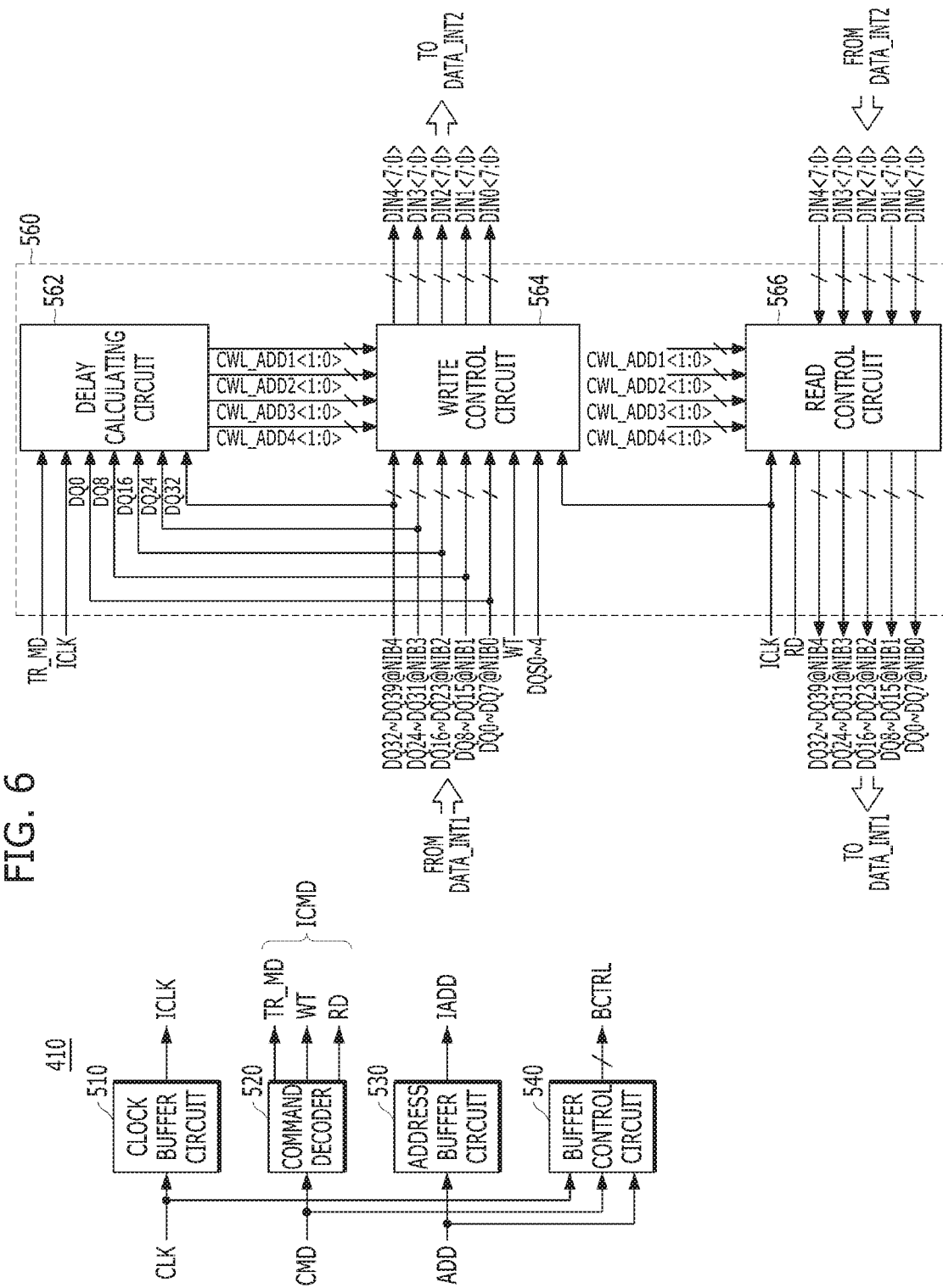
FIG. 6 is a block diagram illustrating a module controller of a memory module in accordance with an embodiment.

FIG. 6 is a block diagram illustrating a module controller of a memory module in accordance with an embodiment. The module controller shown in FIG. 6 may be configured as the module controller 410 in the memory module 400 shown in FIG. 3.

Referring to FIG. 6, the module controller 410 may include a clock buffer circuit 510, a command decoder 520, an address buffer circuit 530, a buffer control circuit 540, and a data processing circuit 560.

The clock buffer circuit 510 may generate an internal clock ICLK by buffering the clock CLK transferred from the memory controller 4.

The command decoder 520 may decode the command CMD, and generate an internal command ICMD by buffering the decoded command CMD for a set time. In the present embodiment, the internal command ICMD may include a write command WT, a read command RD and a training mode signal TR_MD. The write command WT may be a signal inputted in a write operation, the read command RD may be a signal inputted in a read operation, and the training mode signal TR_MD may be enabled for a training mode. However, the internal command ICMD is not limited thereto, but may further include a plurality of commands that are necessary for the operations of the memory module and system.

The address buffer circuit 530 may generate an internal address IADD by buffering the address ADD.

For reference, the internal clock ICLK may be transferred to the first to fifth data buffers DB0 to DB4 through the clock bus CLK_INT of FIG. 3. The internal clock ICLK, the internal command ICMD and the internal address IADD may be transferred to the memory devices 430_00 to 430_14 through another bus CMD/ADD/CLK_INT (not shown).

The buffer control circuit 540 may generate a buffer control signal BCTRL for controlling the data buffers DB0 to DB4 based on the command CMD, the address ADD and the clock CLK, and transfer the buffer control signal BCTRL to the data buffers DB0 to DB4 through the buffer communication bus BCOM<0:3>. The buffer control circuit 540 may convert information for the operations of the data buffers DB0 to DB4 from the information transferred through the command CMD and the address ADD, into the buffer control signal BCTRL suitable for the protocol of the buffer communication bus BCOM<0:3>. The buffer control circuit 540 may receive the entire bits of the address ADD or may receive partial bits of the address ADD.

The data processing circuit 560 may calculate delay times required for transferring data DQ0 to DQ39 depending on locations of the first to fifth data buffers DB0 to DB4 in the training mode and control, based on the calculated delay time, the times at which the data DQ0 to DQ39 are transferred to the memory devices 430_00 to 430_14 or the first to fifth data buffers DB0 to DB4 in the write or read operation.

More specifically, the data processing circuit 560 may include a delay calculating circuit 562, a write control circuit 564 and a read control circuit 566.

The delay calculating circuit 562 may calculate the delay times required for transferring the data DQ0 to DQ39 depending on the locations of the first to fifth data buffers DB0 to DB4 in the training mode and generate first to fourth additional delay signals CWL_ADD1<1:0> to CWL_ADD4<1:0>. When the training mode signal TR_MD is enabled, the delay calculating circuit 562 may receive pulse-type first to fifth training signals DQ0, DQ8, DQ16, DQ24 and DQ32, which are transferred from the first to fifth data buffers DB0 to DB4, respectively, calculate transfer time differences among the first to fifth training signals DQ0, DQ8, DQ16, DQ24 and DQ32 based on the internal clock ICLK, and generate the first to fourth additional delay signals CWL_ADD1<1:0> to CWL_ADD4<1:0>.

In the training mode where the training mode signal TR_MD is enabled, the first to fifth training signals DQ0, DQ8, DQ16, DQ24 and DQ32 may be configured from the data DQ0 to DQ39 transferred from the first to fifth data buffers DB0 to DB4 through the first internal data bus DATA_INT1, and applied as a signal that pulse for a set time. In an embodiment, the first to fifth training signals DQ0, DQ8, DQ16, DQ24 and DQ32 may be configured by the first data DQ0, DQ8, DQ16, DQ24 and DQ32, respectively, among the data DQ0 to DQ39 transferred from the first to fifth data buffers DB0 to DB4. However, the present invention is not limited thereto, and each of the first to fifth training signals may be configured by at least one of the data DQ0 to DQ39, or the first to fifth training signals may be configured by data strobe signals DQS0 to DQS4.

The write control circuit 564 may control the times at which the data are transferred from the first to fifth data buffers DB0 to DB4 to the memory devices 430_00 to 430_14 based on the first to fourth additional delay signals CWL_ADD1<1:0> to CWL_ADD4<1:0>, in the write operation. When the write command WT is inputted, the write control circuit 564 may selectively delay the write data DQ0 to DQ39 transferred from the first to fifth data buffers DB0 to DB4 and output first internal data DIN0<7:0> to DIN4<7:0> based on the first to fourth additional delay signals CWL_ADD1<1:0> to CWL_ADD4<1:0> and the data strobe signals DQS0 to DQS4. The write data DQ0 to DQ39 may be transferred from the first to fifth data buffers DB0 to DB4 through the first internal data bus DATA_INT1 and inputted to the input terminals NIB0 to NIB4, and the first internal data DIN0<7:0> to DIN4<7:0> may be transferred to the memory devices 430_00 to 430_14 through the second internal data bus DATA_INT2.

The read control circuit 566 may control the times at which the data are transferred from the memory devices 430_00 to 430_14 to the first to fifth data buffers DB0 to DB4 based on the first to fourth additional delay signals CWL_ADD1<1:0> to CWL_ADD4<1:0>, in the read operation. When the read command RD is inputted, the read control circuit 566 may selectively delay second internal data DIN0<7:0> to DIN4<7:0> transferred from the memory devices 430_00 to 430_14 and output the read data DQ0 to DQ39 based on the first to fourth additional delay signals CWL_ADD1<1:0> to CWL_ADD4<1:0> and the internal clock ICLK. The second internal data DIN0<7:0> to DIN4<7:0> may be transferred from the memory devices 430_00 to 430_14 through the second internal data bus DATA_INT2, and the read data DQ0 to DQ39 may be outputted through the input terminals NIB0 to NIB4 and transferred to the first to fifth data buffers DB0 to DB4 through the first internal data bus DATA_INT1.

As described above, the module controller 410 in accordance with an embodiment may exchange data between the memory devices 430_00 to 430_14 and the data buffers DB0 to DB4 based on the command CMD, address ADD and clock CLK provided from the memory controller 4, calculate the delay time required for transferring the data depending on the locations of the data buffers DB0 to DB4, and control the data transfer timing based on the calculated delay time.

Figure 7:
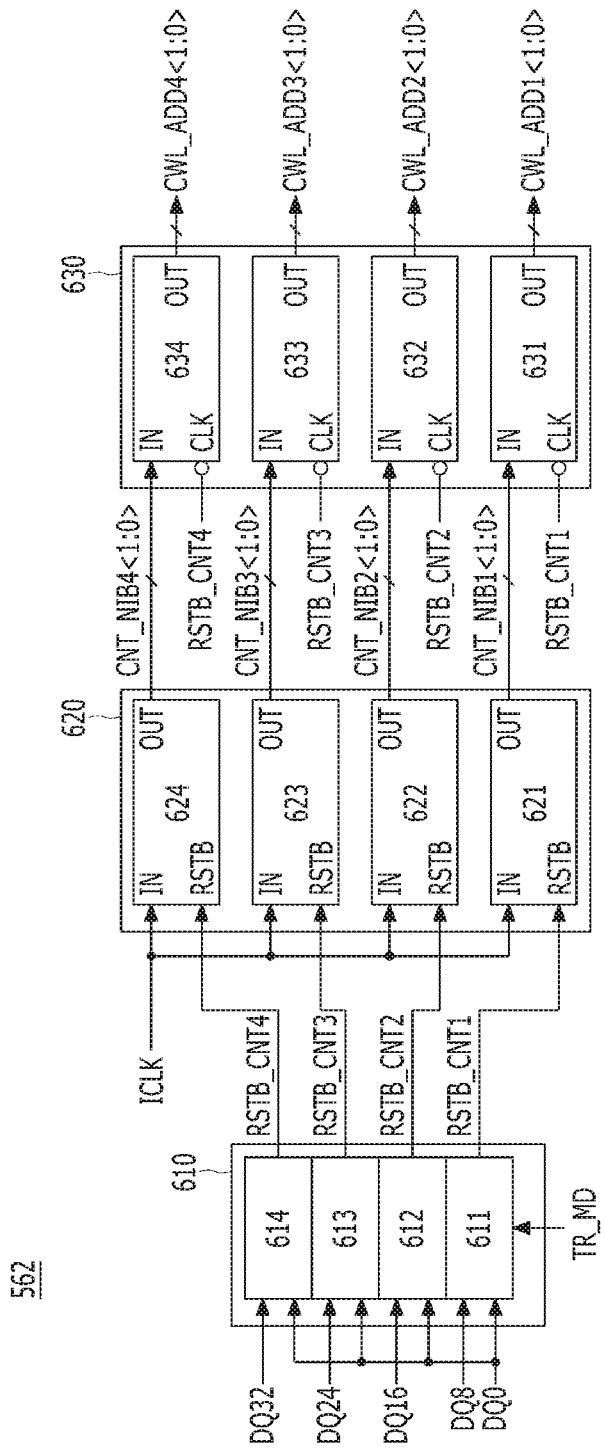
FIG. 7 is a block diagram illustrating a delay calculating circuit such as that shown in FIG. 6.

FIG. 7 is a block diagram illustrating the delay calculating circuit 562 shown in FIG. 6.

Referring to FIG. 7, the delay calculating circuit 562 may include a reset signal generation block 610, a counting block 620 and an additional delay signal generation block 630.

The reset signal generation block 610 may be activated in response to the training mode signal TR_MD, and generate first to fourth reset signals RSTB_CNT1 to RSTB_CNT4 which are disabled according to the first training signal DQ0 transferred from the first data buffer DB0 located farthest from the module controller 410 and enabled according to the second to fifth training signals DQ8, DQ16, DQ24 and DQ32 transferred from the second to fifth data buffers DB1 to DB4 among the first to fifth training signals DQ0, DQ8, DQ16, DQ24 and DQ32.

More specifically, the reset signal generation block 610 may include first to fourth reset generators 611 to 614 for outputting the first to fourth reset signals RSTB_CNT1 to RSTB_CNT4, respectively. For example, the first reset generator 611 may receive the training mode signal TR_MD, the first training signal DQ0 and the second training signal DQ8 and generate the first reset signal RSTB_CNT1. The second reset generator 612 may receive the training mode signal TR_MD, the first training signal DQ0 and the third training signal DQ16 and generate the second reset signal RSTB_CNT2. The third reset generator 613 may receive the training mode signal TR_MD, the first training signal DQ0 and the fourth training signal DQ24 and generate the third reset signal RSTB_CNT3. The fourth reset generator 614 may receive the training mode signal TR_MD, the first training signal DQ0 and the fifth training signal DQ32 and generate the fourth reset signal RSTB_CNT4.

Figure 8:
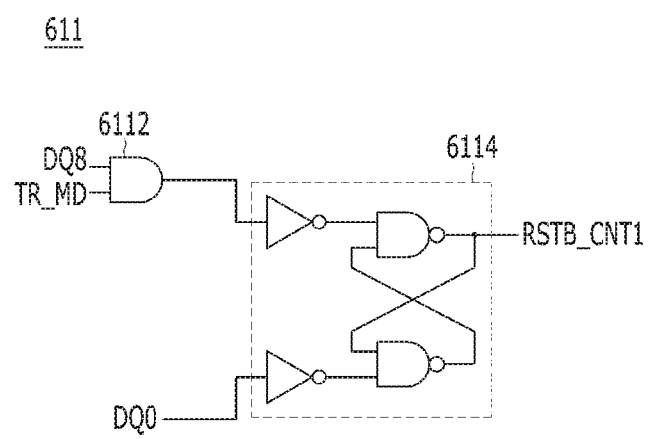
FIG. 8 is a circuit diagram illustrating a first reset generator such as that shown in FIG. 7.

FIG. 8 is a circuit diagram illustrating the first reset generator 611 shown in FIG. 7. For reference, the configurations and components of the second to fourth reset generators 612 to 614 are substantially the same as those of the first reset generator 611.

Referring to FIG. 8, the first reset generator 611 may include a logic gate 6112 and an SR latch 6114. The logic gate 6112 may perform an AND operation on the training mode signal TR_MD and the second training signal DQ8. The SR latch 6114 may be set according to output of the logic gate 6112 and reset based on the first training signal DQ0. The first reset generator 611 with the above-described configuration may be enabled when the training mode signal TR_MD is enabled and generate the first reset signal RSTB_CNT1 which is enabled according to the second training signal DQ8 and disabled according to the first training signal DQ0.

Referring back to FIG. 7, the counting block 620 may generate first to fourth counting signals CNT_NIB1<1:0> to CNT_NIB4<1:0> by counting a number of cycles or toggles of the internal clock ICLK while the first to fourth reset signals RSTB_CNT1 to RSTB_CNT4 remain enabled.

More specifically, the counting block 620 may include first to fourth 2-bit counters 621 to 624 for outputting the first to fourth reset signals RSTB_CNT1 to RSTB_CNT4, respectively. For example, the first counter 621 may be reset based on the first reset signal RSTB_CNT1 and may generate the 2-bit first counting signal CNT_NIB1<1:0> by counting the number of cycles or toggles of the internal clock ICLK while the first reset signal RSTB_CNT1 stays enabled.

The additional delay signal generation block 630 may latch the first to fourth counting signals CNT_NIB1<1:0> to CNT_NIB4<1:0> and generate the first to fourth additional delay signals CWL_ADD1<1:0> to CWL_ADD4<1:0>. The additional delay signal generation block 630 may latch the first to fourth counting signals CNT_NIB1<1:0> to CNT_NIB4<1:0> when the first to fourth reset signals RSTB_CNT1 to RSTB_CNT4 become disabled, respectively.

More specifically, the additional delay signal generation block 630 may include first to fourth additional delay generators 631 to 634 for generating the first to fourth additional delay signals CWL_ADD1<1:0> to CWL_ADD4<1:0>, respectively. The first to fourth additional delay generators 631 to 634 may correspond to the first to fourth reset signals RSTB_CNT1 to RSTB_CNT4, respectively, and may latch a corresponding counting signal when a corresponding reset signal becomes disabled and output the latched signal as a corresponding additional delay signal. For example, the first additional delay generator 631 may latch the first counting signal CNT_NIB1<1:0> when the first reset signal RSTB_CNT1 becomes disabled and output the latched signal as the first additional delay signal CWL_ADD1<1:0>.

Hereinafter, operations of the delay calculating circuit 562 will be described with reference to the drawings, in particular FIGS. 9 and 10.

Figure 9:
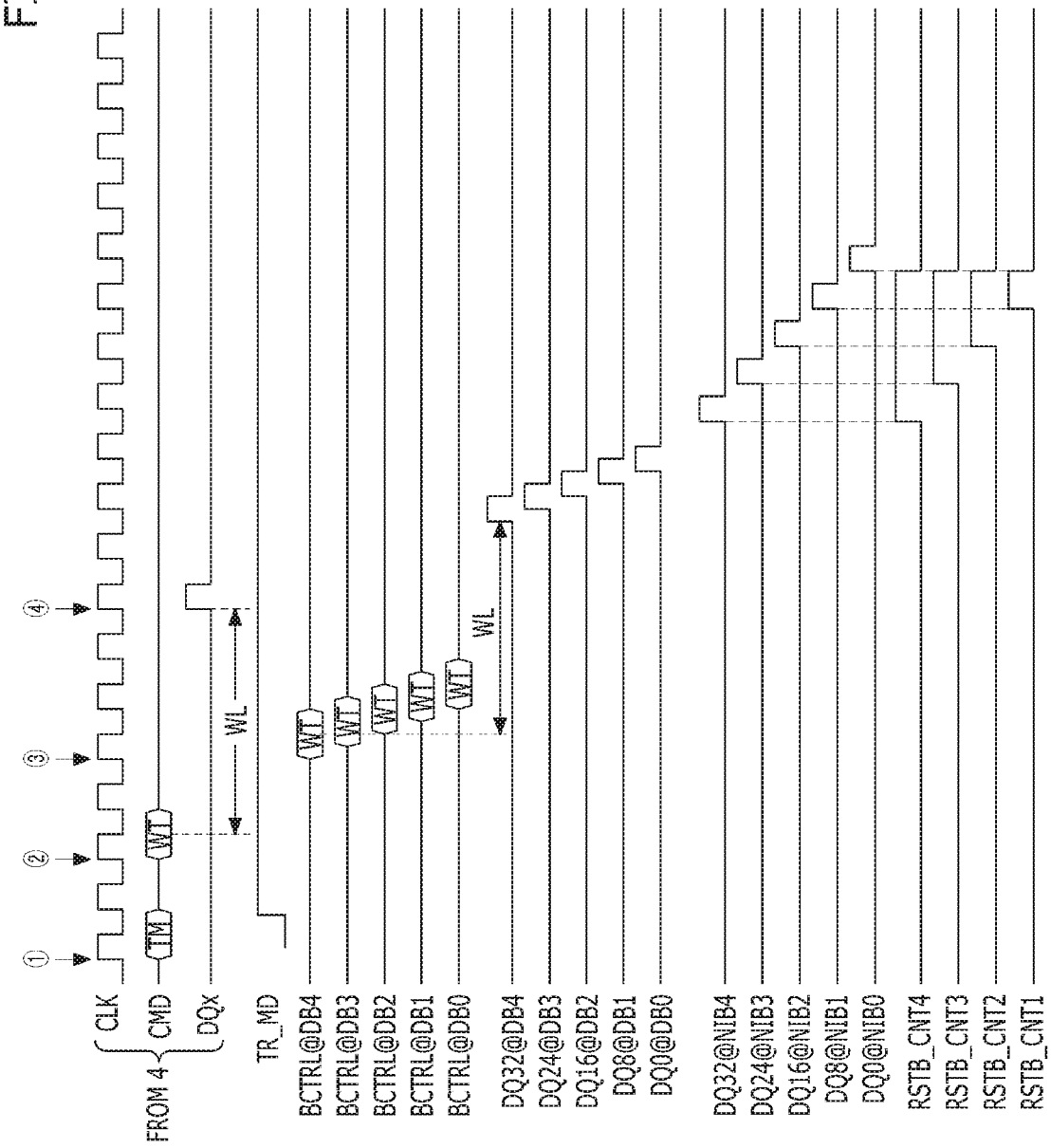
FIGS. 9 and 10 are timing diagrams illustrating operations of a delay calculating circuit shown in FIG. 6.
Figure 10:
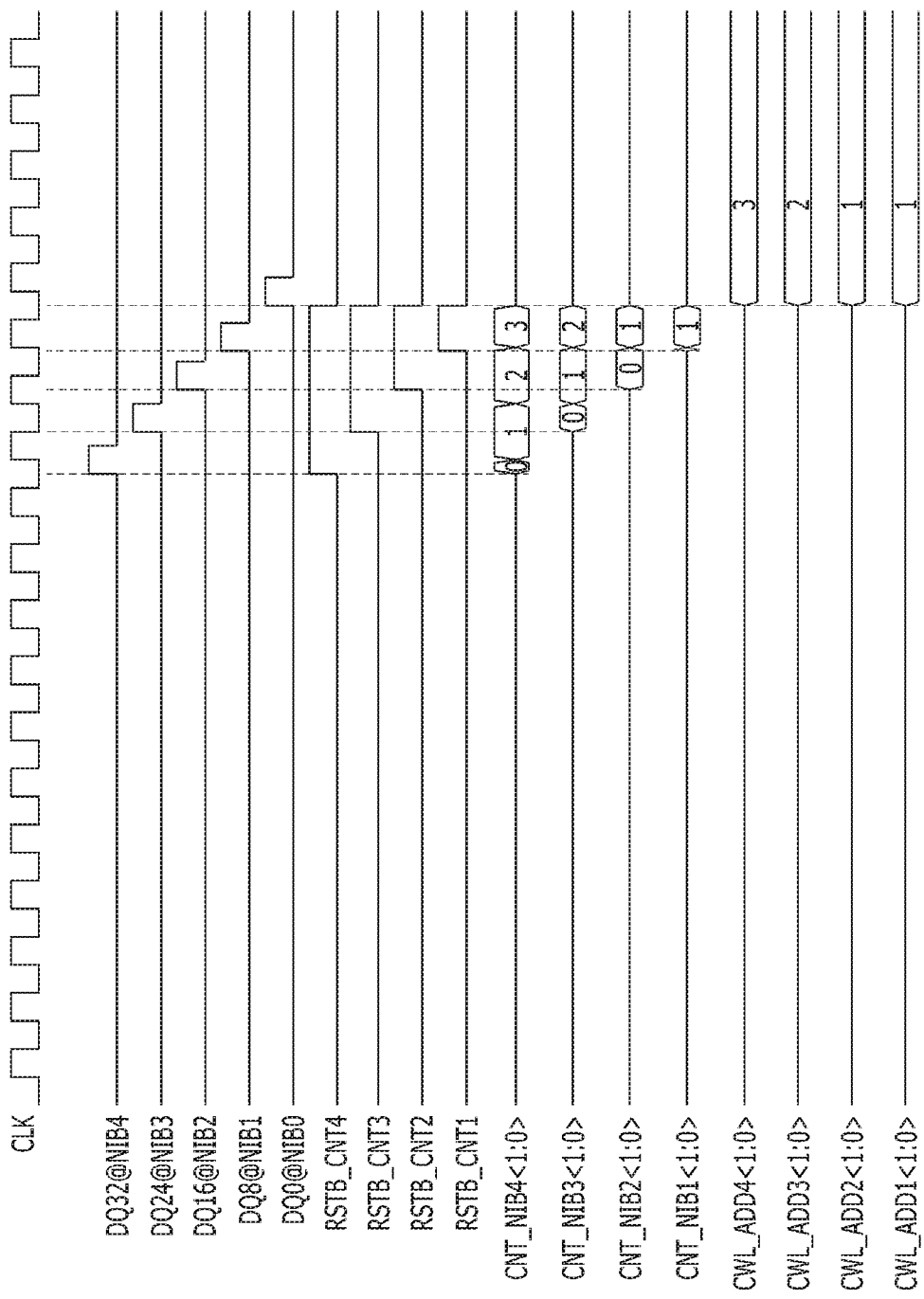

FIGS. 9 and 10 are timing diagrams for describing the operations of the delay calculating circuit 562 shown in FIG. 6.

FIG. 9 illustrates an operation of generating the first to fourth reset signals RSTB_CNT1 to RSTB_CNT4 based on the first to fifth training signals DQ0, DQ8, DQ16, DQ24 and DQ32. FIG. 10 illustrates an operation of generating the first to fourth additional delay signals CWL_ADD1<1:0> to CWL_ADD4<1:0> based on the first to fourth reset signals RSTB_CNT1 to RSTB_CNT4.

Referring to FIG. 9, at a first time point ①, the command CMD initiating the training mode is transferred to the module controller 410 from the memory controller 4. The command decoder 520 may decode and buffer the command CMD, and enable the training mode signal TR_MD. Accordingly, the module controller 410 may enter the training mode.

At a second time point ②, the write command WT may be transferred to the module controller 410 from the memory controller 4. At a third time point (when two periods of the clock CLK elapse from the second time point ②, the module controller 410 may transfer the buffer control signal BCTRL to the first to fifth data buffers DB0 to DB4 through the buffer communication bus BCOM<0:3> simultaneously while transferring the write command WT to the memory devices 430_00 to 430_14.

Since the physical locations of the data buffers DB0 to DB8 with reference to the module controller 410 are different from one another, the buffer control signal BCTRL reaches the data buffers DB0 to DB4 through the buffer communication bus BCOM<0:3> at different times. For example, the fifth data buffer DB4 may receive a buffer control signal BCTRL@DB4 without delay at the third time point ③, and the first to fourth data buffers DB0 to DB3 may receive buffer control signals BCTRL@DB3, BCTRL@DB2, BCTRL@DB1 and BCTRL@DB0, respectively, at different times, separated by a set time interval, from the third time point ③. The delays of the buffer control signals BCTRL@DB3, BCTRL@DB2, BCTRL@DB1 and BCTRL@DB0 may become greater due to the physical locations of the first to fourth data buffers DB0 to DB3.

In the training mode, at a fourth time point ④ when a write latency WL elapses from the first time point ①, the pulse-type first to fifth training signals DQx, for example, DQ0, DQ8, DQ16, DQ24 and DQ32, are inputted to the module controller 410 from the memory controller 4. The first to fifth data buffers DB0 to DB4 may receive the first to fifth training signals DQ0, DQ8, DQ16, DQ24 and DQ32, respectively, with a set time interval according to the times at which the buffer control signals BCTRL@DB0 to BCTRL@DB4 are transferred.

The reset signal generation block 610 may be activated according to the training mode signal TR_MD, and generate the first to fourth reset signals RSTB_CNT1 to RSTB_CNT4 which are enabled based on the second to fifth training signals DQ8, DQ16, DQ24 and DQ32, respectively, and disabled based on the first training signal DQ0. In other words, the first to fourth reset signals RSTB_CNT1 to RSTB_CNT4 may be sequentially enabled due to the physical locations of the first to fourth data buffers DB0 to DB3 and simultaneously disabled, which generates different enabled durations of the first to fourth reset signals RSTB_CNT1 to RSTB_CNT4. The enabled durations of the first to fourth reset signals RSTB_CNT1 to RSTB_CNT4 may become longer.

Referring to FIG. 10, the counting block 620 generates the first to fourth counting signals CNT_NIB1<1:0> to CNT_NIB4<1:0> by counting the number of cycles or toggles of the internal clock ICLK while the first to fourth reset signals RSTB_CNT1 to RSTB_CNT4 stay enabled. For example, the first counter 621 and the second counter 622 may generate the first counting signal CNT_NIB1<1:0> and second counting signal CNT_NIB2<1:0> of binary "01", i.e., decimal number "1" by counting the number of cycles or toggles of the internal clock ICLK while the first reset signal RSTB_CNT1 stays enabled. In this manner, the third counter 623 may generate the third counting signal CNT_NIB3<1:0> of "10", i.e., decimal number "2", and fourth counter 624 may generate the fourth counting signal CNT_NIB4<1:0> of "11", i.e., decimal number "3".

The additional delay signal generation block 630 latches the first to fourth counting signals CNT_NIB1<1:0> to CNT_NIB4<1:0> when the first to fourth reset signals RSTB_CNT1 to RSTB_CNT4 become disabled, respectively, and outputs the latched signals as the first to fourth additional delay signals CWL_ADD1<1:0> to CWL_ADD4<1:0>.

As described above, when the training mode signal TR_MD is enabled, the delay calculating circuit 562 of the module controller 410 may generate the first to fourth additional delay signals CWL_ADD1<1:0> to CWL_ADD4<1:0> by counting the internal clock ICLK during time periods from when the first training signal DQ0 transferred from the first data buffer DB0 located farthest from the module controller 410 is enabled to when the second to fifth training signals DQ8, DQ16, DQ24 and DQ32 transferred from the second to fifth data buffers DB1 to DB4 are enabled, respectively.

Figure 11:
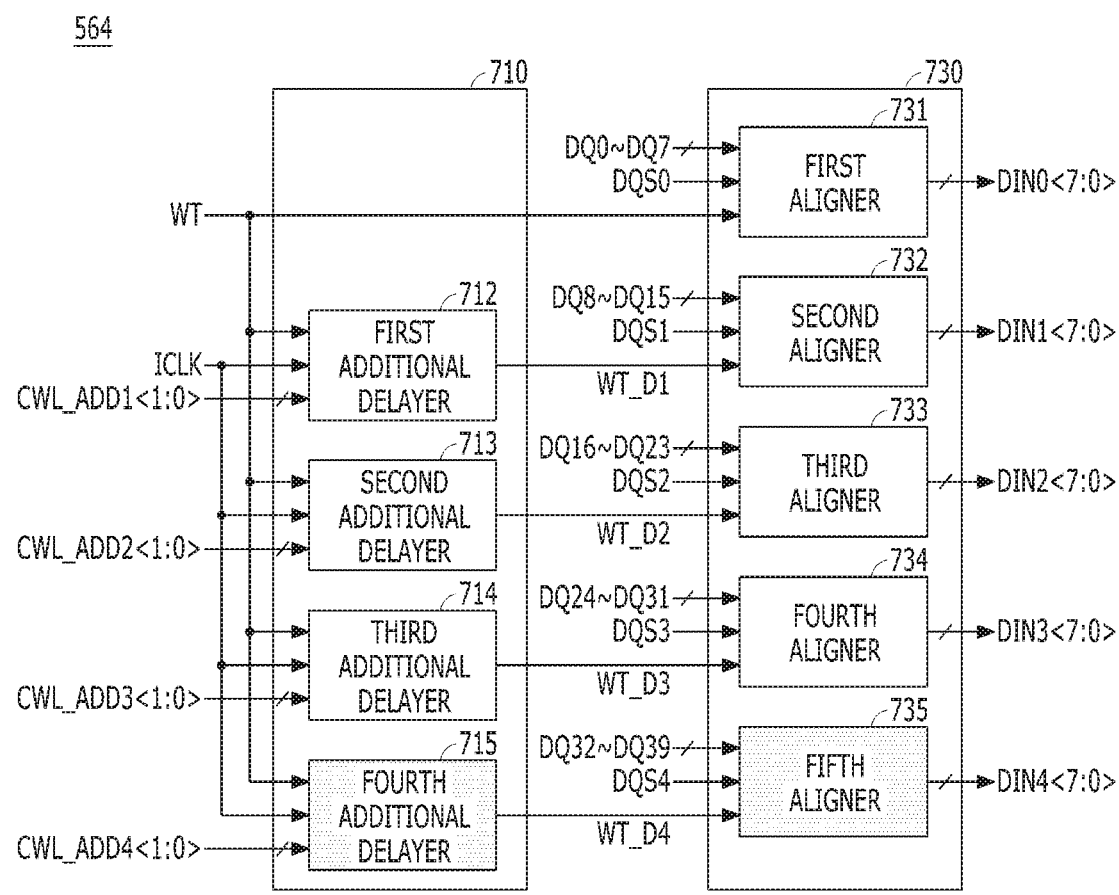
FIG. 11 is a block diagram illustrating a write control circuit such as that shown in FIG. 6.

FIG. 11 is a block diagram illustrating the write control circuit 564 shown in FIG. 6.

Referring to FIG. 11, the write control circuit 564 may include an additional delay block 710 and a data alignment block 730.

The additional delay block 710 may generate first to fourth delayed write signals WT_D1 to WT_D4 by delaying the write command WT based on the first to fourth additional delay signals CWL_ADD1<1:0> to CWL_ADD4<1:0> and the internal clock ICLK. The first to fourth delayed write signals WT_D1 to WT_D4 may be used to align the write data DQ8 to DQ39 transferred from the second to fifth data buffers DB1 to DB4.

More specifically, the additional delay block 710 may include first to fourth additional delayers 712 to 715 for generating the first to fourth delayed write signals WT_D1 to WT_D4, respectively. For example, the fourth additional delayer 715 may delay the write command WT based on the fourth additional delay signal CWL_ADD4<1:0> and the internal clock ICLK, and output the fourth delayed write signal WT_D4.

Figure 12:
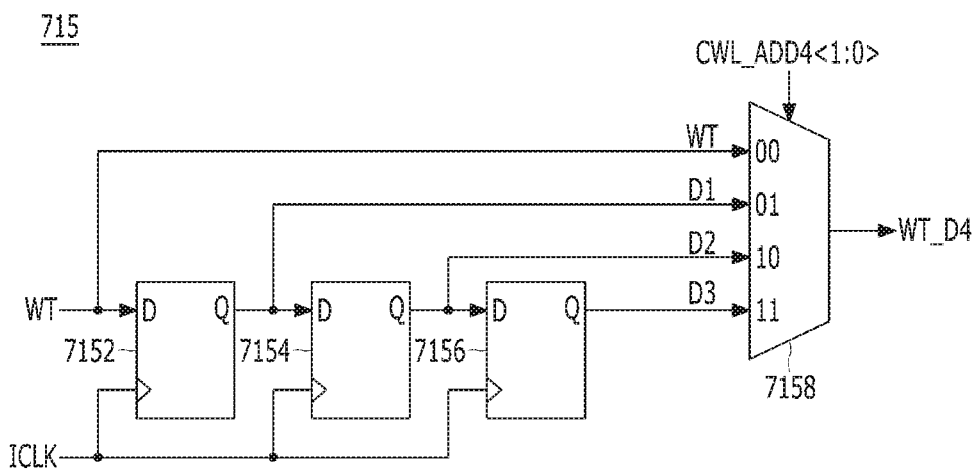
FIG. 12 is a block diagram illustrating a fourth additional delayer such as that shown in FIG. 11.

FIG. 12 is a block diagram illustrating the fourth additional delayer 715 shown in FIG. 11. The configurations and components of the first to third additional delayers 712 to 714 are substantially the same as those of the fourth additional delayer 715.

Referring to FIG. 12, the fourth additional delayer 715 may include first to third flip-flops 7152 to 7156 and a multiplexer 7158. The first to third flip-flops 7152 to 7156 may be coupled in series to one another, receive the write command WT through respective input terminals thereof, and sequentially output first to third delay signals D1 to D3 in synchronization with the internal clock ICLK. The multiplexer 7158 may select one of the write command WT and the first to third delay signals D1 to D3 based on the fourth additional delay signal CWL_ADD4<1:0> and output the selected command or signal as the fourth delayed write signal WT_D4. For example, when the fourth additional delay signal CWL_ADD4<1:0> is set to "11", the multiplexer 7158 may output the third delay signal D3 as the fourth delayed write signal WT_D4. The fourth additional delayer 715 having the above-described structure may output the fourth delayed write signal WT_D4, which is generated by delaying the write command WT based on the fourth additional delay signal CWL_ADD4<1:0> in synchronization with the internal clock ICLK.

Referring back to FIG. 11, the data alignment block 730 may align the write data DQ0 to DQ39 and output the first internal data DIN0<7:0> to DIN4<7:0>, based on the data strobe signals DQS0 to DQS4, the write command WT and the first to fourth delayed write signals WT_D1 to WT_D4.

More specifically, the data alignment block 730 may include first to fifth aligners 731 to 735 for receiving the write command WT and the first to fourth delayed write signals WT_D1 to WT_D4, respectively. For example, the first aligner 731 may align the write data DQ0 to DQ7 based on the data strobe signal DQS0 and the write command WT, and output the first internal data DIN0<7:0>. The data strobe signal DQS0 and the write data DQ0 to DQ7 are signals transferred from the first data buffer DB0. The fifth aligner 735 may align the write data DQ32 to DQ39 based on the data strobe signal DQS4 and the fourth delayed write signal WT_D4, and output the first internal data DIN4<7:0>. The data strobe signal DQS4 and the write data DQ32 to DQ39 are signals transferred from the fifth data buffer DB4.

Figure 13:
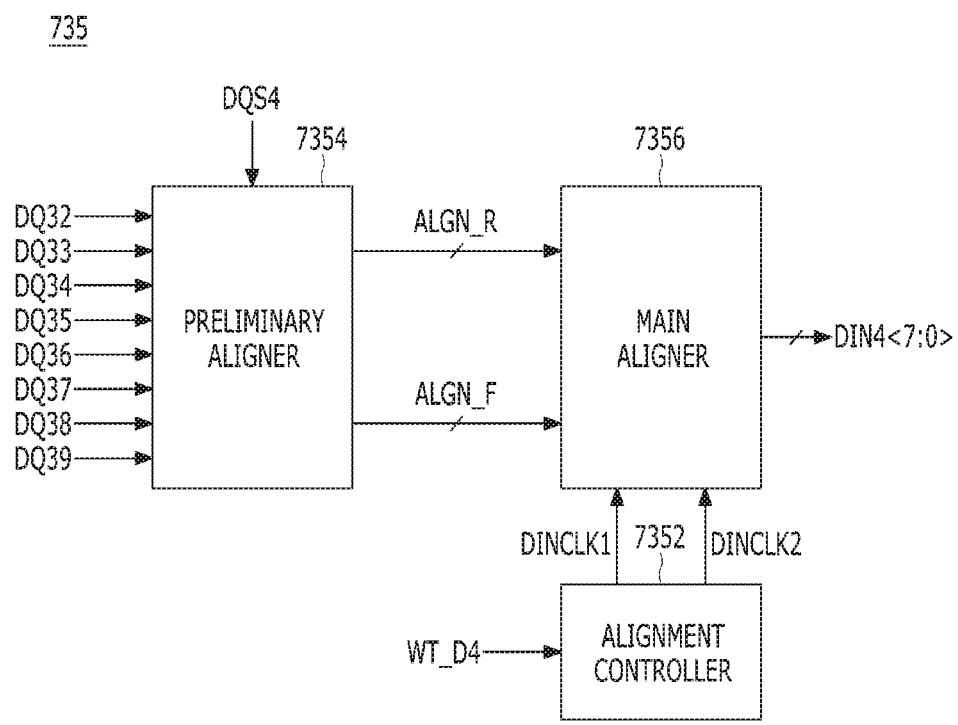
FIG. 13 is a block diagram illustrating a fifth aligner such as that shown in FIG. 11.

FIG. 13 is a block diagram illustrating the fifth aligner 735 shown in FIG. 11. The configurations and components of the first to fourth aligner 731 to 734 are substantially the same as those of the fifth aligner 735.

Referring to FIG. 13, the fifth aligner 735 may include an alignment controller 7352, a preliminary aligner 7354 and a main aligner 7356.

The alignment controller 7352 may generate first and second alignment signals DINCLK1 and DINCLK2 based on the fourth delayed write signal WT_D4. The alignment controller 7352 may receive the fourth delayed write signal WT_D4 and output the first and second alignment signals DINCLK1 and DINCLK2 with a set time delay in consideration of the write latency WL.

The preliminary aligner 7354 may latch the write data DQ32 to DQ39 based on the data strobe signal DQS4 and output first and second preliminary data ALGN_R and ALGN_F.

The main aligner 7356 may latch the first and second preliminary data ALGN_R and ALGN_F based on the first and second alignment signals DINCLK1 and DINCLK2, respectively, and output the first internal data DIN4<7:0>.

Hereinafter, operations of the write control circuit 564 will be described with reference to the drawings. It is assumed that the first to fourth additional delay signals CWL_ADD1<1:0> to CWL_ADD4<1:0> are set to "01", "01", "10" and "11", respectively.

Figure 14:
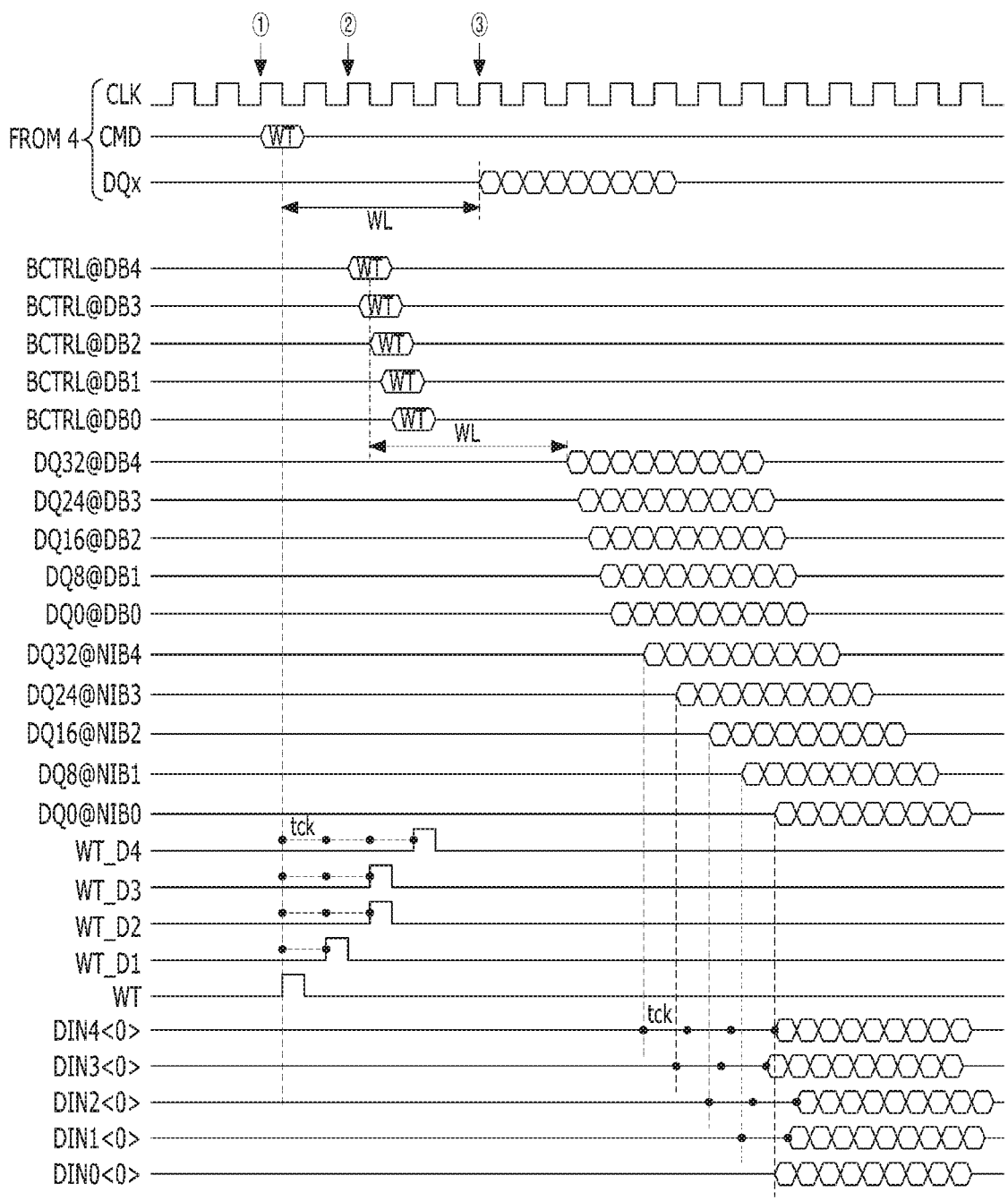
FIG. 14 is a timing diagram illustrating operations of a write control circuit such as that shown in FIG. 11.

FIG. 14 is a timing diagram for describing the operations of the write control circuit 564 shown in FIG. 11.

Referring to FIG. 14, at a first time point ①, the write command WT is transferred to the module controller 410 from the memory controller 4. Accordingly, the module controller 410 may perform the write operation.

At a second time point ②, i.e., after two periods of the clock CLK elapse from the first time point ①, the module controller 410 may transfer the buffer control signal BCTRL to the first to fifth data buffers DB0 to DB4 simultaneously while transferring the write command WT to the memory devices 430_00 to 430_14. Since the physical locations of the data buffers DB0 to DB8 with reference to the module controller 410 are different from one another, the buffer control signals BCTRL@DB0 to BCTRL@DB4 reach the respective data buffers DB0 to DB4 at different times. Accordingly, the buffer control signals BCTRL@DB0 to BCTRL@DB4 may reach the respective data buffers DB0 to DB4 with set time intervals.

Subsequently, at a third time point ③ when the write latency WL elapses from the first time point ①, data DQx is inputted to the module controller 410 from the memory controller 4. Since the times at which the buffer control signals BCTRL@DB0 to BCTRL@DB4 reach the data buffers DB0 to DB4, respectively, are different from one another, the fifth data buffer DB4 located closest to the module controller 410 may receive data DQ32@DB4 at the earliest time, and the first data buffer DB0 located farthest from the module controller 410 may receive data DQ0@DB0 at the latest time.

The data buffers DB0 to DB4 transfer the data DQ0 to DQ39 to the module controller 410. Since the physical locations of the data buffers DB0 to DB8 with reference to the module controller 410 are different from one another, the data DQ0 to DQ39 reach the respective input terminals NIB0 to NIB4 of the module controller 410 at significantly different times.

The additional delay block 710 generates the first to fourth delayed write signals WT_D1 to WT_D4 by individually delaying the write command WT based on the first to fourth additional delay signals CWL_ADD1<1:0> to CWL_ADD4<1:0> and the internal clock ICLK. The additional delay block 710 may delay the write command WT by one period of the internal clock ICLK and output the first additional delay signal CWL_ADD1<1:0>. The additional delay block 710 may delay the write command WT by two periods of the internal clock ICLK and output the second and third additional delay signals CWL_ADD2<1:0> and CWL_ADD3<1:0>. The additional delay block 710 may delay the write command WT by three periods of the internal clock ICLK and output the fourth additional delay signal CWL_ADD4<1:0>.

The data alignment block 730 may align the write data DQ0 to DQ39 based on the data strobe signals DQS0 to DQS4, the write command WT and the first to fourth delayed write signals WT_D1 to WT_D4 and output the first internal data DIN0<7:0> to DIN4<7:0>. Consequently, as shown in FIG. 14, skews among the first internal data DIN0<7:0> to DIN4<7:0> that the module controller 410 transfers to the memory devices 430_00 to 430_14 may be reduced to within 1tCK.

Although detailed configurations of the read control circuit 566 are not provided here, the read control circuit 566 may operate in a similar manner to the write control circuit 564. That is, when the read command RD is inputted, the read control circuit 566 may control the times at which data transferred from the memory devices 430_00 to 440 are transferred to the first to fifth data buffers DB0 to DB4 based on the first to fourth additional delay signals CWL_ADD1<1:0> to CWL_ADD4<1:0>.

As is apparent from the above description, the memory module including the module controller for transferring data between the memory devices and the data buffers in accordance with embodiments calculates the delay time required for transferring the data between the data buffers and the module controller in the training mode. By adjusting the data transfer timing according to the calculated delay time in the write operation or the read operation, the memory module may reduce skew which occurs when the data reach the memory devices or the data buffers, thereby improving the operational margin of the memory module.

In accordance with embodiments, the operational margin of the memory module may be improved by compensating for the skew caused by the physical positions or the difference in louting lengths between the module controller and the data buffers in the memory module.

While the present invention has been illustrated and described with respect to specific embodiments, the disclosed embodiments are not intended to be restrictive, but rather descriptive. Further, it is noted that the present invention may be achieved in various ways through substitution, change, and modification, as would be apparent to those skilled in the art in light of the present disclosure, without departing from the spirit and/or scope of the present invention as defined by the following claims.

What is claimed is:

1. A memory module comprising:
   a plurality of memory devices;
   a plurality of data buffers suitable for exchanging data with a memory controller; and
   a module controller suitable for transferring the data inputted through the data buffers to the memory devices in the write operation, and transferring the data read from the memory devices to the data buffers in the read operation, based on a command, an address and a clock provided from the memory controller, calculating delay times for transferring the data according to locations of the data buffers with reference to the module controller, and controlling times at which the data are transferred based on the calculated delay times,
   wherein the module controller includes:
   a command decoder suitable for generating a training mode signal, a write command and a read command by decoding the command;
   a delay calculating circuit suitable for receiving a plurality of training signals transferred from the data buffers when the training mode signal is enabled, and generating a plurality of additional delay signals by calculating transfer time differences among the training signals based on the clock; and
   a write control circuit suitable for selectively delaying write data transferred from the data buffers based on the additional delay signals and outputting first internal data to the memory devices, when the write command is inputted, and
   wherein the delay calculating circuit includes:
   a reset signal generation block operable in response to the training mode signal and suitable for generating a plurality of reset signals which are disabled based on a training signal transferred from the data buffer located farthest among the training signals and enabled based on training signals transferred from the other data buffers;

a counting block suitable for generating a plurality of counting signals by counting the number of cycles of the clock during periods when the reset signals are enabled; and an additional delay signal generation block suitable for generating the additional delay signals by latching the counting signals.

2. The memory module of claim 1, wherein the module controller calculates the delay times by generating, in a training mode, a plurality of additional delay signals by counting clock cycles from when a training signal transferred from the data buffer located farthest from the module controller becomes enabled to when training signals transferred from the other data buffers become enabled, and wherein, in the write operation, the module controller selectively delays the data transferred from the data buffers based on the additional delay signals and outputs the delayed data to the memory devices.

3. The memory module of claim 1, wherein the module controller calculates the delay times by generating, in a training mode, a plurality of additional delay signals by counting clock cycles from when a training signal transferred from the data buffer located farthest from the module controller becomes enabled to when training signals transferred from the other data buffers become enabled, and wherein, in the read operation, the module controller selectively delays the data transferred from the memory devices based on the additional delay signals and outputs the delayed data to the data buffers.

4. The memory module of claim 1, further comprising: a read control circuit suitable for selectively delaying second internal data transferred from the memory devices based on the additional delay signals and outputting read data to the data buffers, when the read command is inputted.

5. The memory module of claim 1, wherein the reset signal generation block includes a plurality of reset generators suitable for generating the plurality of reset signals, respectively, and wherein each of the reset generators includes:

a logic gate suitable for performing an AND operation on the training mode signal and a corresponding signal of the training signals transferred from the other data buffers; and an SR latch suitable for generating the reset signal which is enabled according to output of the logic gate and disabled based on the training signal transferred from the data buffer located farthest.

6. The memory module of claim 1, wherein the additional delay signal generation block latches the respective counting signals when the reset signals are disabled.

7. The memory module of claim 1, wherein the write control circuit includes:

an additional delay block suitable for generating a plurality of delayed write signals by delaying the write command based on the additional delay signals and the clock; and a data alignment block suitable for aligning the respective write data based on a data strobe signal, the write command and the delayed write signals and outputting the first internal data.

8. The memory module of claim 7, wherein the additional delay block includes a plurality of additional delayers, wherein each of the additional delayers includes:

a plurality of flip-flops coupled in series, and suitable for receiving the write command through respective input terminals thereof and outputting a plurality of delay signals in synchronization with the clock; and a multiplexer suitable for selecting one of the write command and the delay signals based on a corresponding additional delay signal and outputting the selected command or signal as a corresponding delayed write signal.

9. The memory module of claim 7, wherein the data alignment block includes a plurality of aligners suitable for receiving the write command and the delayed write signals, respectively, and wherein each of the aligners includes:

an alignment controller suitable for generating first and second alignment signals based on the write command and a corresponding signal among the delayed write signals;

a preliminary aligner suitable for latching the write data based on the data strobe signal and outputting preliminary data; and a main aligner suitable for latching the preliminary data based on the first and second alignment signals and outputting the first internal data.

10. The memory module of claim 1, wherein each of the memory devices comprises a dynamic random access memory (DRAM), and wherein the memory module comprises a dual in-line memory module (DIMM).

11. A memory system comprising:

a memory module; and a memory controller suitable for providing a command, an address and a clock to the memory module, and exchanging data with the memory module, wherein the memory module includes:

a plurality of memory devices;

a plurality of data buffers suitable for exchanging data with the memory controller; and a module controller suitable for transferring the data inputted through the data buffers to the memory devices in a write operation, and transferring the data read from the memory devices to the data buffers in a read operation, based on the command, the address and the clock, calculating delay times for transferring the data according to locations of the data buffers with reference to the module controller, and controlling times at which the data are transferred based on the calculated delay times, wherein the module controller includes:

a command decoder suitable for generating a training mode signal, a write command and a read command by decoding the command;

a delay calculating circuit suitable for receiving a plurality of training signals transferred from the data buffers when the training mode signal is enabled, and generating a plurality of additional delay signals by calculating transfer time differences among the training signals based on the clock; and a write control circuit suitable for selectively delaying write data transferred from the data buffers based on the additional delay signals and outputting first internal data to the memory devices, when the write command is inputted, and wherein the delay calculating circuit includes:

a reset signal generation block operable in response to the training mode signal and suitable for generating a plurality of reset signals which are disabled based on a training signal transferred from the data buffer located farthest among the training signals and enabled based on training signals transferred from the other data buffers;

a counting block suitable for generating a plurality of counting signals by counting the number of cycles of the clock during periods when the reset signals are enabled; and an additional delay signal generation block suitable for generating the additional delay signals by latching the counting signals.

12. The memory system of claim 11, further comprising: a read control circuit suitable for selectively delaying second internal data transferred from the memory devices based on the additional delay signals and outputting read data to the data buffers, when the read command is inputted.

13. The memory system of claim 11, wherein the write control circuit includes:

an additional delay block suitable for generating a plurality of delayed write signals by delaying the write command based on the additional delay signals and the clock; and a data alignment block suitable for aligning the respective write data based on a data strobe signal, the write command and the delayed write signals and outputting the first internal data.

14. An operating method of a memory module including a plurality of memory devices, a plurality of data buffers and a module controller, the operating method comprising:

generating, at the module controller, in a training mode, a plurality of additional delay signals by counting clock cycles from when a training signal transferred from a data buffer, among the data buffers, located farthest from a module controller to when training signals transferred from the other of the data buffers become enabled; and selectively delaying the data transferred from the data buffers, at the module controller, based on the additional delay signals and outputting the delayed data to memory devices, in a write operation, wherein the generating of the plurality of additional delay signals includes:

generating, in response to a training mode signal, a plurality of reset signals which remain enabled between when a training signal transferred from the data buffer located farthest from the module controller becomes enabled and when training signals transferred from the other data buffers becomes enabled;

generating a plurality of counting signals by counting the number of cycles of the clock when the reset signals are enabled; and generating the additional delay signals by latching the counting signals.

15. The operating method of claim 14, further comprising: selectively delaying the data transferred from the memory devices based on the additional delay signals and outputting the delayed data to the data buffers, in a read operation.

16. A memory module comprising:

a plurality of memory devices;

a plurality of data buffers configured to exchange data with a memory controller;

a command decoder configured to generate a training mode signal, a write command, and a read command by decoding a command and an address provided by the memory controller;

a delay calculating circuit configured to receive a plurality of training signals transferred from the data buffers when the training mode signal is enabled, the delay calculating circuit having a reset signal generation block configured to operate in response to the training mode signal and generate a plurality of reset signals which are disabled based on a training signal transferred from a data buffer located farthest among the training signals and enabled based on training signals transferred from other data buffers, and a counting block configured to generate a plurality of counting signals by counting the number of cycles of a clock during periods when the reset signals are enabled, and an additional delay signal generation block configured to generate additional delay signals by latching the counting signals; and a write control circuit configured to selectively delay write data transferred from the data buffers based on the additional delay signals and output first internal data to the memory devices, when the write command is inputted.

* * * * *